(12) United States Patent
Hirano et al.

(10) Patent No.: US 10,643,849 B2
(45) Date of Patent: May 5, 2020

(54) MANUFACTURING METHOD OF NITRIDE SEMICONDUCTOR ULTRAVIOLET LIGHT EMITTING ELEMENT, AND NITRIDE SEMICONDUCTOR ULTRAVIOLET LIGHT EMITTING ELEMENT

(71) Applicant: Soko Kagaku Co., Ltd., Ishikawa (JP)

(72) Inventors: Akira Hirano, Aichi (JP); Yosuke Nagasawa, Nara (JP); Shigefusa Chichibu, Miyagi (JP); Kazunobu Kojima, Miyagi (JP)

(73) Assignee: SOKO KAGAKU CO., LTD., Ishikawa (JP)

( * ) Notice: Subject to any disclaimer, the term of this patent is extended or adjusted under 35 U.S.C. 154(b) by 0 days.

(21) Appl. No.: 16/330,320

(22) PCT Filed: Nov. 8, 2017

(86) PCT No.: PCT/JP2017/040170
§ 371 (c)(1),
(2) Date: Mar. 4, 2019

(87) PCT Pub. No.: WO2018/150651
PCT Pub. Date: Aug. 23, 2018

(65) Prior Publication Data
US 2019/0228972 A1 Jul. 25, 2019

(30) Foreign Application Priority Data
Feb. 15, 2017 (JP) .................................. 2017-026244

(51) Int. Cl.
*H01L 21/205* (2006.01)
*H01L 33/32* (2010.01)
(Continued)

(52) U.S. Cl.
CPC ........ *H01L 21/205* (2013.01); *H01L 21/0242* (2013.01); *H01L 21/0254* (2013.01);
(Continued)

(58) Field of Classification Search
None
See application file for complete search history.

(56) References Cited

U.S. PATENT DOCUMENTS

| 8,227,789 B2 | 7/2012 | Hirayama et al. |
| 2005/0211995 A1 | 9/2005 | Du et al. |

(Continued)

FOREIGN PATENT DOCUMENTS

| CN | 101515618B B | 12/2010 |
| DE | 102005013580 A1 | 10/2005 |

(Continued)

OTHER PUBLICATIONS

Chichibu, et al., "Impacts of Si-doping and resultant cation vacancy formation on the luminescence dynamics for the near-band-edge emission of Al0.6Ga0.4N films grown on AlN templates by metalorganic vapor phase epitaxy," Journal of Applied Physics vol. 113, Issue 21, Jun. 3, 2013, 7 pages.

(Continued)

*Primary Examiner* — Angel Roman
(74) *Attorney, Agent, or Firm* — Haynes Beffel & Wolfeld LLP

(57) ABSTRACT

A manufacturing method of a nitride semiconductor ultraviolet light-emitting element having a peak emission wavelength of 285 nm or shorter comprises a first step of forming an n-type semiconductor layer composed of an n-type $Al_XGa_{1-X}N$-based semiconductor ($1 \geq X \geq 0.5$) on an upper surface of an underlying portion including a sapphire substrate, a second step of forming, above the n-type semiconductor layer, an active layer that includes a light-emitting (Continued)

layer composed of an $Al_YGa_{1-Y}N$-based semiconductor (X>Y>0) and that is composed of an AlGaN-based semiconductor as a whole, and a third step of forming a p-type semiconductor layer composed of a p-type $Al_ZGa_{1-Z}N$-based semiconductor (1≥Z>Y) above the active layer. In the manufacturing method, a growth temperature at the second step is higher than 1200° C. and equal to or higher than a growth temperature at the first step.

16 Claims, 6 Drawing Sheets

(51) Int. Cl.
*H01L 33/06* (2010.01)
*H01L 21/02* (2006.01)

(52) U.S. Cl.
CPC .... *H01L 21/0262* (2013.01); *H01L 21/02433* (2013.01); *H01L 21/02458* (2013.01); *H01L 21/02505* (2013.01); *H01L 21/02576* (2013.01); *H01L 33/06* (2013.01); *H01L 33/32* (2013.01); *H01L 21/02631* (2013.01)

(56) References Cited

U.S. PATENT DOCUMENTS

| | | |
|---|---|---|
| 2012/0012010 A1 | 1/2012 | Baraille et al. |
| 2014/0103289 A1 | 4/2014 | Liao et al. |
| 2014/0158983 A1 | 6/2014 | Pemot et al. |
| 2014/0209857 A1 | 7/2014 | Takano et al. |
| 2016/0027962 A1 | 1/2016 | Liao et al. |
| 2016/0079471 A1 | 3/2016 | Liao et al. |
| 2016/0211411 A1 | 7/2016 | Liao et al. |
| 2017/0025565 A1 | 1/2017 | Liao et al. |
| 2017/0263817 A1 | 9/2017 | Hirano et al. |
| 2017/0317229 A1* | 11/2017 | Liao .................. C23C 16/54 |
| 2018/0261725 A1 | 9/2018 | Kaneda et al. |

FOREIGN PATENT DOCUMENTS

| | | |
|---|---|---|
| JP | 2002280610 A | 9/2002 |
| JP | 2005032803 A | 2/2005 |
| JP | 2011187591 A | 9/2011 |
| JP | 2012089754 A | 5/2012 |
| JP | 5641173 B2 | 12/2014 |
| JP | 2015005534 A | 1/2015 |
| JP | 2015043468 A | 3/2015 |
| RU | 2561761 C1 | 9/2015 |
| RU | 2664755 C1 | 8/2018 |
| RU | 2676178 C1 | 12/2018 |
| WO | 2013005789 A1 | 1/2013 |
| WO | 2017013729 A1 | 1/2017 |

OTHER PUBLICATIONS

Michael Kneissl, "A Brief Review of III-Nitride UV Emitter Technologies and Their Applications", III-Nitride Ultraviolet Emitters, Chapter 1, Nov. 13, 2015, 26 pages.

Uedono, et al., Native cation vacancies in Si-doped AlGaN studied by monoenergetic positron beams, J. Appl. Phys. 111, 013512, Jan. 6, 2012, 6 pages.

* cited by examiner

MANUFACTURING METHOD OF NITRIDE SEMICONDUCTOR ULTRAVIOLET LIGHT EMITTING ELEMENT, AND NITRIDE SEMICONDUCTOR ULTRAVIOLET LIGHT EMITTING ELEMENT

TECHNICAL FIELD

The present invention relates to a nitride semiconductor ultraviolet light-emitting element including a light-emitting layer composed of an AlGaN-based semiconductor and having a peak emission wavelength of 285 nm or shorter, and a manufacturing method of the nitride semiconductor ultraviolet light-emitting element.

BACKGROUND ART

Conventionally, nitride semiconductor light-emitting elements in which a light-emitting layer that emits light by recombination of carriers (electrons and holes) is composed of a GaN-based semiconductor or an InGaN-based semiconductor have been widely used. Meanwhile, nitride semiconductor ultraviolet light-emitting elements having a shorter emission wavelength than the nitride semiconductor light-emitting elements mentioned above and including a light-emitting layer composed of an AlGaN-based semiconductor are proposed in, for example, Patent Document 1 and the like, but still have not been widely used.

This is because in the nitride semiconductor ultraviolet light-emitting elements including the light-emitting layer composed of the AlGaN-based semiconductor, as the peak emission wavelength is shortened (as the Al composition ratio of the light-emitting layer is increased and the Ga composition ratio thereof is reduced), the light emission efficiency is reduced. The light emission efficiency of a semiconductor light-emitting element is represented as quantum efficiency that is the ratio of converting injected electrons into photons. The ratio when focusing on photons generated inside a light-emitting element is referred to as internal quantum efficiency whereas the rate when focusing on photons discharged outside the light-emitting element is referred to as external quantum efficiency.

Such a problem is described with reference to the drawings. FIGS. 5 and 6 are graphs of the relationship between the peak emission wavelength and the external quantum efficiency of nitride semiconductor light-emitting elements. FIG. 5 is a graph described in Non-Patent Document 1 and obtained by collecting data reported in academic papers and the like by various companies and research institutions. FIG. 6 is a graph obtained by measuring samples made by the inventors of the present application in the past. The horizontal axis of each of the graphs shown in FIGS. 5 and 6 represents the peak emission wavelength whereas the vertical axis thereof represents the external quantum efficiency. In FIG. 5, for the convenience of description of the drawings, a curve that is not a precise approximate curve but represents the overall trend of points and a broken line that indicates a peak emission wavelength of 285 nm are added to the graph described in Non-Patent Document 1.

As shown in FIGS. 5 and 6, in nitride semiconductor ultraviolet light-emitting elements having a peak emission wavelength of 285 nm or shorter, as the peak emission wavelength is shortened, the external quantum efficiency is sharply reduced. This shows that the nitride semiconductor ultraviolet light-emitting elements having a peak emission wavelength of 285 nm or shorter have their specific problems that do not occur in nitride semiconductor light-emitting elements having a peak emission wavelength longer than 285 nm. In addition, these problems occur in the nitride semiconductor ultraviolet light-emitting elements having a peak emission wavelength of 285 nm or shorter without exception, and even in recent years, have not yet been solved.

PRIOR ART DOCUMENTS

Patent Document

Patent Document 1: Japanese Patent No. 5641173

Non-Patent Document

Non-Patent Document 1: Michael Kneissl, "A Brief Review of III-Nitride UV Emitter Technologies and Their Applications", III-Nitride Ultraviolet Emitters, Chapter 1, 2016

SUMMARY OF THE INVENTION

Problems to be Solved by the Invention

As a result of intensive research on the above-described problems specific to nitride semiconductor ultraviolet light-emitting elements having a peak emission wavelength of 285 nm or shorter, the inventors of the present application have identified the causes of the problems and found solutions to the problems.

Consequently, an object of the present invention is to provide a nitride semiconductor ultraviolet light-emitting element having a peak emission wavelength of 285 nm or shorter that overcomes the specific problems described above to achieve improved light emission efficiency, and a manufacturing method of the nitride semiconductor ultraviolet light-emitting element.

Means for Solving the Problem

To achieve the above object, the present invention provides a manufacturing method of a nitride semiconductor ultraviolet light-emitting element having a peak emission wavelength of 285 nm or shorter. The manufacturing method comprises a first step of forming an n-type semiconductor layer composed of an n-type $Al_XGa_{1-X}$N-based semiconductor ($1 \geq X \geq 0.5$) on an upper surface of an underlying portion including a sapphire substrate, a second step of forming, above the n-type semiconductor layer, an active layer that includes a light-emitting layer composed of an $Al_YGa_{1-Y}$N-based semiconductor ($X>Y>0$) and that is composed of an AlGaN-based semiconductor as a whole, and a third step of forming a p-type semiconductor layer composed of a p-type $Al_ZGa_{1-Z}$N-based semiconductor ($1 \geq Z>Y$) above the active layer. A growth temperature at the second step is higher than 1200° C. and equal to or higher than a growth temperature at the first step.

As the growth temperature of the active layer is higher than 1200° C. in the manufacturing method of a nitride semiconductor ultraviolet light-emitting element, the number of Al vacancies in the light-emitting layer included in the active layer can be reduced. It is thus possible to reduce the number of Al vacancies in the light-emitting layer, which are the cause of decrease in light emission efficiency of the nitride semiconductor ultraviolet light-emitting element having a peak emission wavelength of 285 nm or shorter.

In the manufacturing method of a nitride semiconductor ultraviolet light-emitting element described above, a growth temperature at the second step may be higher than a growth temperature at the first step.

In the manufacturing method of a nitride semiconductor ultraviolet light-emitting element, a temperature suitable for the growth of the n-type $Al_XGa_{1-X}$N-based semiconductor (1≥X≥0.5) composing the n-type semiconductor layer can be selected as the growth temperature of the n-type semiconductor layer that is required to grow thicker than other layers because the n-type semiconductor layer requires to be exposed for the purpose of forming an n-electrode thereon, and then a temperature higher than the growth temperature of the n-type semiconductor layer can be separately selected as the growth temperature of the active layer. It is thus possible to prevent the production efficiency of the nitride semiconductor ultraviolet light-emitting element from being significantly degraded.

The manufacturing method of a nitride semiconductor ultraviolet light-emitting element described above may further comprise a fourth step of forming a first decomposition prevention layer following the n-type semiconductor layer at a same growth temperature as the first step immediately after the first step, at which the n-type semiconductor layer composed of an n-type $Al_XGa_{1-X}$N-based semiconductor (1>X≥0.5) is formed. The first decomposition prevention layer is composed of an $Al_\alpha Ga_{1-\alpha}$N-based semiconductor (1≥α>X), and has a thickness of 3 nm or less. At least after the fourth step ends, a growth temperature may be increased and then the second step may be performed.

In the manufacturing method of a nitride semiconductor ultraviolet light-emitting element, when a growth temperature is increased from the growth temperature at the first step to the growth temperature at the second step, the first decomposition prevention layer is formed on an upper surface of the n-type semiconductor layer and thus the n-type semiconductor layer is not exposed. It is thus possible to prevent degradation of characteristics of the nitride semiconductor ultraviolet light-emitting element caused by the decomposition of GaN in the n-type semiconductor layer.

In the manufacturing method of a nitride semiconductor ultraviolet light-emitting element described above, a growth temperature at the third step may be lower than a growth temperature at the second step.

In the manufacturing method of a nitride semiconductor ultraviolet light-emitting element, it is possible to increase the amount of an acceptor impurity doped as compared to a case where a p-type semiconductor layer is grown at a same growth temperature as the active layer.

In the manufacturing method of a nitride semiconductor ultraviolet light-emitting element described above, an uppermost layer of the active layer may be composed of an $Al_{Y1}Ga_{1-Y}$N-based semiconductor (X>Y1≥Y). The manufacturing method may further comprise a fifth step of forming a second decomposition prevention layer following the active layer at a same growth temperature as the second step immediately after the second step. The second decomposition prevention layer is composed of an $Al_\beta Ga_{1-\beta}$N-based semiconductor (1≥β≥Y), and has a thickness of 3 nm or less. At least after the fifth step ends, a growth temperature may be reduced and then the third step may be performed.

In the manufacturing method of a nitride semiconductor ultraviolet light-emitting element, when a growth temperature is reduced from the growth temperature at the second step to the growth temperature at the third step, the second decomposition prevention layer is formed on an upper surface of the active layer and thus the active layer is not exposed. It is thus possible to prevent degradation of characteristics of the nitride semiconductor ultraviolet light-emitting element caused by the decomposition of GaN in the active layer.

The manufacturing method of a nitride semiconductor ultraviolet light-emitting element described above may further comprise a sixth step of forming a p-type contact layer composed of a p-type $Al_QGa_{1-Q}$N-based semiconductor (Z>Q≥0) above the p-type semiconductor layer. A growth temperature at the sixth step may be lower than a growth temperature at the third step.

In the manufacturing method of a nitride semiconductor ultraviolet light-emitting element, as the growth temperature of the p-type contact layer in which the Ga composition ratio is larger than that of the p-type semiconductor layer and thus GaN is intensively decomposed (re-evaporated) during growth is lower than the growth temperature of the p-type semiconductor layer, the p-type contact layer can be efficiently grown.

The manufacturing method of a nitride semiconductor ultraviolet light-emitting element described above may further comprise a seventh step of forming a third decomposition prevention layer following the p-type semiconductor layer at a same growth temperature as the third step immediately after the third step, at which the p-type semiconductor layer composed of a p-type $Al_ZGa_{1-Z}$N-based semiconductor (1>Z>Y) may be formed at the third step. The third decomposition prevention layer is composed of an $Al_\gamma Ga_{1-\gamma}$N-based semiconductor (1≥γ>Z), and has a thickness of 3 nm or less. At least after the seventh step ends, a growth temperature may be reduced and then the sixth step may be performed.

In the manufacturing method of a nitride semiconductor ultraviolet light-emitting element, when a growth temperature is reduced from the growth temperature at the third step to the growth temperature at the sixth step, the third decomposition prevention layer is formed on an upper surface of the p-type semiconductor layer and thus the p-type semiconductor layer is not exposed. It is thus possible to prevent degradation of characteristics of the nitride semiconductor ultraviolet light-emitting element caused by the decomposition of GaN in the p-type semiconductor layer.

In the manufacturing method of a nitride semiconductor ultraviolet light-emitting element described above, a growth temperature at the sixth step may be lower than a growth temperature at the third step by 150° C. or more.

In the manufacturing method of a nitride semiconductor ultraviolet light-emitting element, while it takes a long time to reduce a growth temperature from the growth temperature at the third step to the growth temperature at the sixth step, the third decomposition prevention layer is formed on the upper surface of the p-type semiconductor layer and thus the p-type semiconductor layer is not exposed. It is thus possible to prevent degradation of characteristics of the nitride semiconductor ultraviolet light-emitting element caused by the decomposition of GaN in the p-type semiconductor layer.

The manufacturing method of a nitride semiconductor ultraviolet light-emitting element described above may further comprise an eighth step of performing a thermal treatment at a temperature higher than 1200° C. while supplying a gas containing 50% or more of nitrogen at least after the second step ends.

In the manufacturing method of a nitride semiconductor ultraviolet light-emitting element, the movement of Al atoms slightly shifted from crystal lattice positions thereof in the light-emitting layer is facilitated and thus the number of Al vacancies in the light-emitting layer can be further reduced. In addition, it is possible to prevent the decomposition of AlN and GaN, and prevent the generation of N vacancies or reduce the number of N vacancies.

In the manufacturing method of a nitride semiconductor ultraviolet light-emitting element described above, a growth temperature at the third step may be equal to or lower than 1100° C.

In the manufacturing method of a nitride semiconductor ultraviolet light-emitting element, the growth temperature at the third step is not so high. If the growth temperature is reduced from the growth temperature at the third step to the growth temperature at the sixth step, the decomposition of GaN in the p-type semiconductor layer does not become a concern. Consequently, it is possible to prevent the decomposition of GaN in the p-type semiconductor layer without providing the third decomposition prevention layer.

In the manufacturing method of a nitride semiconductor ultraviolet light-emitting element described above, the second step may be a step of forming the active layer that has a single or multiple quantum well structure in which one or more well layers functioning as the light-emitting layer and one or more barrier layers composed of an $Al_RGa_{1-R}N$-based semiconductor ($1>R>Y$) are alternately laminated.

As the single or multiple quantum well structure is employed in the manufacturing method of a nitride semiconductor ultraviolet light-emitting element, the light emission efficiency can be enhanced.

In the manufacturing method of a nitride semiconductor ultraviolet light-emitting element described above, a growth temperature at the second step may be equal to or higher than 1250° C.

As the active layer is grown at a temperature equal to or higher than 1250° C. in the manufacturing method of a nitride semiconductor ultraviolet light-emitting element, the migration of Al atoms is sufficiently accelerated to effectively reduce the number of Al vacancies in the light-emitting layer.

Moreover, the present invention provides a nitride semiconductor ultraviolet light-emitting element having a peak emission wavelength of 285 nm or shorter. The nitride semiconductor ultraviolet light-emitting element comprises an underlying portion including a sapphire substrate, an n-type semiconductor layer composed of an n-type $Al_XGa_{1-X}N$-based semiconductor ($1>X≥0.5$), the n-type semiconductor layer being formed on an upper surface of the underlying portion, an active layer that includes a light-emitting layer composed of an $Al_YGa_{1-Y}N$-based semiconductor ($X>Y>0$) and that is composed of an AlGaN-based semiconductor as a whole, the active layer being formed above the n-type semiconductor layer, and a p-type semiconductor layer composed of a p-type $Al_ZGa_{1-Z}N$-based semiconductor ($1≥Z>Y$), the p-type semiconductor layer being formed above the active layer. An Al composition ratio on an upper surface of the n-type semiconductor layer is larger than that inside of the n-type semiconductor layer, or a first decomposition prevention layer composed of an $Al_αGa_{1-α}N$-based semiconductor ($1≥α>X$) and having a thickness of 3 nm or less is formed on the upper surface of the n-type semiconductor layer.

According to the nitride semiconductor ultraviolet light-emitting element, it is possible to grow the active layer at a temperature higher than the growth temperature of the n-type semiconductor layer for the purpose of reducing the number of Al vacancies in the light-emitting layer, which are the cause of decrease in light emission efficiency of the nitride semiconductor ultraviolet light-emitting element having a peak emission wavelength of 285 nm or shorter, while preventing the production efficiency from being significantly degraded.

In the nitride semiconductor ultraviolet light-emitting element described above, an uppermost layer of the active layer may be composed of an $Al_{Y1}Ga_{1-Y1}N$-based semiconductor ($X>Y1≥Y$), and an Al composition ratio on an upper surface of the uppermost layer may be larger than that inside of the uppermost layer, or a second decomposition prevention layer composed of an $Al_βGa_{1-β}N$-based semiconductor ($1≥β>Y1$) and having a thickness of 3 nm or less may be formed on an upper surface of the active layer.

According to the nitride semiconductor ultraviolet light-emitting element, it is possible to grow the p-type semiconductor layer at a temperature lower than the growth temperature of the active layer for the purpose of increasing the amount of an acceptor impurity doped in the p-type semiconductor layer.

In the nitride semiconductor ultraviolet light-emitting element described above, the p-type semiconductor layer may be composed of a p-type $Al_ZGa_{1-Z}N$-based semiconductor ($1>Z>Y$). The nitride semiconductor ultraviolet light-emitting element may further comprise a p-type contact layer composed of a p-type $Al_QGa_{1-Q}N$-based semiconductor ($Z>Q≥0$), the p-type contact layer being formed above the p-type semiconductor layer. An Al composition ratio on an upper surface of the p-type semiconductor layer may be larger than that inside of the p-type semiconductor layer, or a third decomposition prevention layer composed of an $Al_γGa_{1-γ}N$-based semiconductor ($1≥γ>Z$) and having a thickness of 3 nm or less may be formed on the upper surface of the p-type semiconductor layer.

According to the nitride semiconductor ultraviolet light-emitting element, it is possible to grow the p-type contact layer at a temperature lower than the growth temperature of the p-type semiconductor layer for the purpose of efficiently growing the p-type contact layer.

Effect of the Invention

According to the nitride semiconductor ultraviolet light-emitting element and the manufacturing method of the nitride semiconductor ultraviolet light-emitting element, it is possible to reduce the number of Al vacancies in the light-emitting layer, which are the cause of decrease in light emission efficiency of the nitride semiconductor ultraviolet light-emitting element having a peak emission wavelength of 285 nm or shorter. It is thus possible to improve the light emission efficiency of the nitride semiconductor ultraviolet light-emitting element having a peak emission wavelength of 285 nm or shorter.

DESCRIPTION OF EMBODIMENT

<Cause of Decrease in Light Emission Efficiency>

Figure 1:
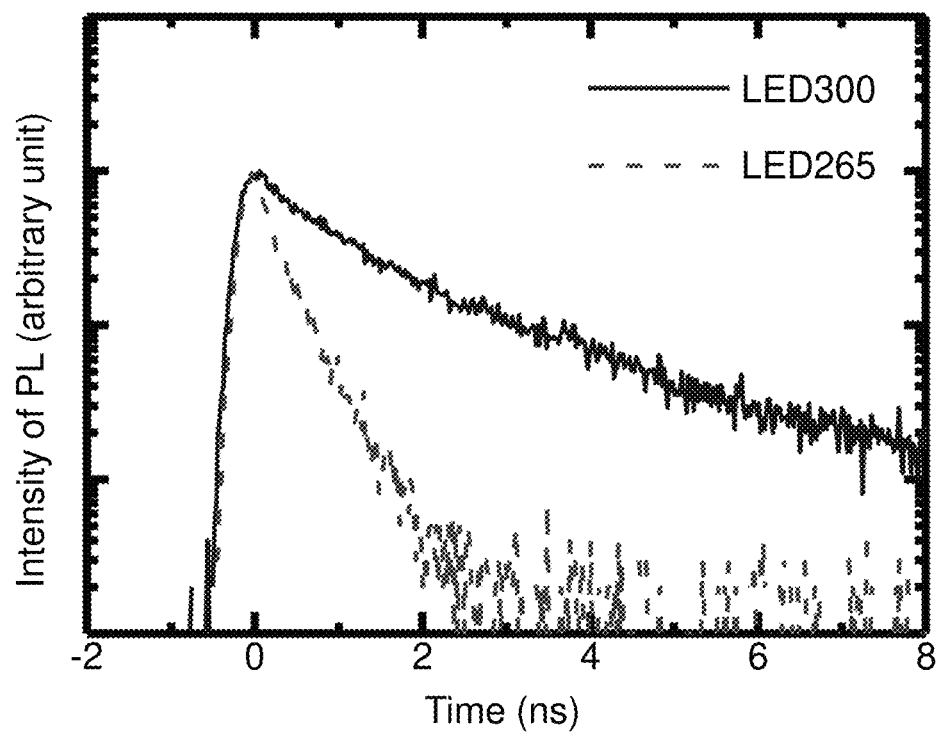
FIG. 1 is a graph showing decay curves, which are measurement results of time-resolved PL on two types of nitride semiconductor ultraviolet light-emitting elements having different peak emission wavelengths.

The cause of decrease in light emission efficiency of a nitride semiconductor ultraviolet light-emitting element having a peak emission wavelength of 285 nm or shorter, which is identified by the inventors of the present application, is described first with reference to the drawings. FIG. 1 is a graph showing measurement results of time-resolved PL (Photoluminescence) on two types of nitride semiconductor ultraviolet light-emitting elements having different peak emission wavelengths. In the graph shown in FIG. 1, the vertical axis represents the intensity of PL and the horizontal axis represents the time.

Samples for measuring time-resolved PL are formed by laminating, on a (0001) surface of a sapphire substrate, an AlN layer, a Si-doped n-type AlGaN layer, an active layer having a multiple quantum well structure in which an AlGaN well layer and an AlGaN barrier layer are laminated for three periods, and a Mg-doped p-type AlGaN layer in this order. In addition, to achieve a desired peak emission wavelength, the composition ratio of Al and Ga in each of the layers above the AlN layer is adjusted. In particular, as the Al composition ratio of the AlGaN well layer, which is a light-emitting layer that emits light by recombination of carriers (electrons and holes), is increased, the peak emission wavelength is reduced. For this reason, the Al composition ratio of the AlGaN well layer is determined so that the desired peak emission wavelength is achieved. In addition, to enable carriers to efficiently flow into the light-emitting layer (the AlGaN well layer), the Al composition ratio of the AlGaN barrier layer is adjusted to be larger than that of the AlGaN well layer. Moreover, the Al composition ratio of the n-type and p-type AlGaN layers is adjusted to be equal to or larger than that of the AlGaN barrier layer.

There are two types of samples to be measured. One is adjusted to have a peak emission wavelength of 300 nm (hereinafter, "LED300") and the other is adjusted to have a peak emission wavelength of 265 nm (hereinafter, "LED265"). As described above, the Al composition ratio of an AlGaN well layer in LED265 is larger than that of an AlGaN well layer in LED300. For both the samples, excitation light (having a wavelength of 244 nm to 266 nm), which is triple harmonic of a titanium-sapphire laser, is applied to a side of the p-type AlGaN layer at room temperature, and PL from the side of the p-type AlGaN layer is detected.

The measurement results of time-resolved PL shown in FIG. 1 represent a process in which carriers excited by light are relaxed to be in the ground state (electrons and holes disappear), and are useful for evaluating the crystallinity of the samples. By using a relaxation time obtained by fitting an exponential function to the measurement results of time-resolved PL, it is possible to quantitatively compare relaxation processes. The relaxation time is calculated by fitting the following formula (1) to each of the measurement results of LED265 and LED300 shown in FIG. 1. The following formula (1) represents a function used for fitting in two types of relaxation processes, that is, a fast relaxation process and a slow relaxation process, and is commonly used for measurement results of time-resolved PL. In the following formula (1), $\tau_1$ denotes the relaxation time in the fast relaxation process and $\tau_2$ denotes the relaxation time in the slow relaxation process.

[Formula 1]

$$f(t) = A_1 \exp\left(-\frac{t}{\tau_1}\right) + A_2 \exp\left(-\frac{t}{\tau_2}\right) \quad (1)$$

When the above formula (1) is fitted to the measurement results of time-resolved PL shown in FIG. 1, the relaxation time $\tau_1$ of LED300 is 0.682 ns whereas the relaxation time $\tau_1$ of LED265 is 0.164 ns, which is much shorter than the relaxation time $\tau_1$ of LED300. When considering the fact that the measurement results shown in FIG. 1 are obtained at room temperature and non-radiative recombination easily occurs due to carriers being captured by defects or the like, this result shows that the relaxation process by the non-radiative recombination is dominant in LED265 as compared to LED300.

In addition, it is known that in AlGaN, the non-radiative recombination center is mainly a cation vacancy complex (a complex of cation vacancies, which are Ga and Al vacancies, and nitrogen vacancies), and as the Al composition ratio is increased, the number of the cation vacancies is also increased (for example, Uedono et al. Journal of Applied Physics 111 013512 2012, Chichibu et al. Journal of Applied Physics 113 213506 2013).

Figure 5:
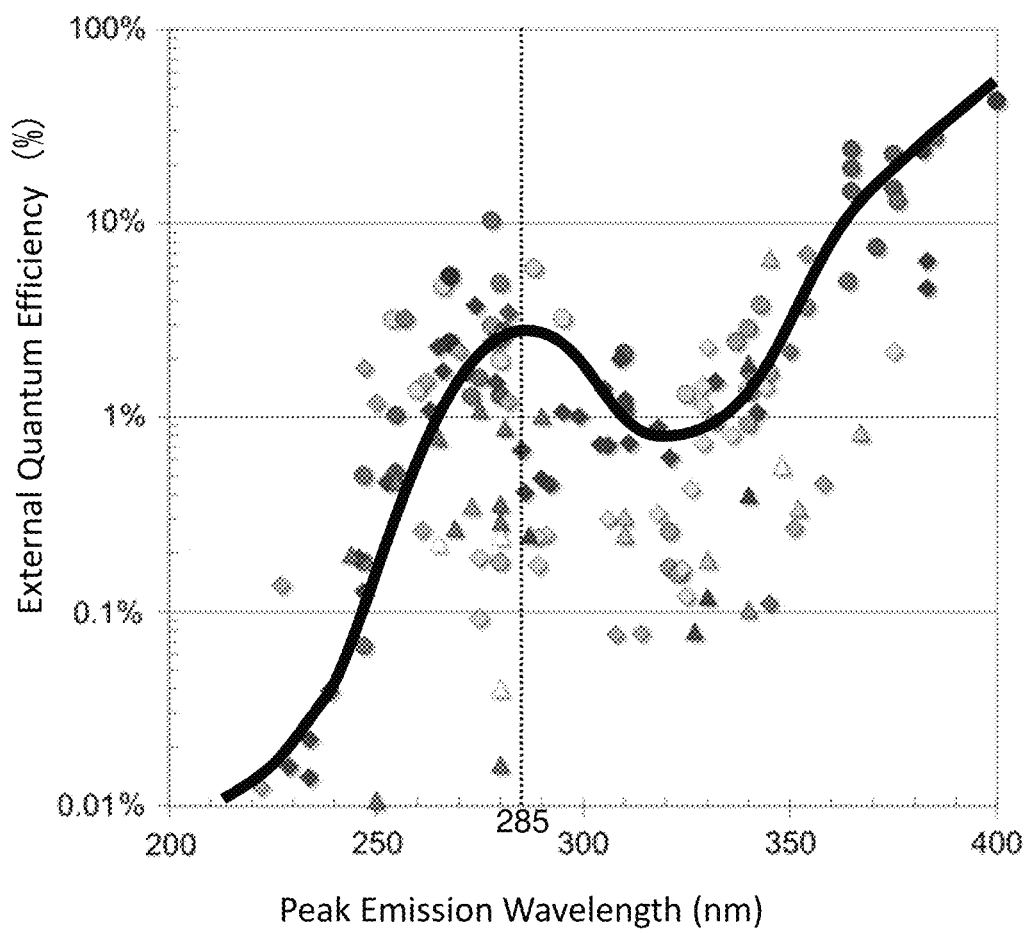
FIG. 5 is a graph showing the relationship between the peak emission wavelength and the external quantum efficiency of a nitride semiconductor light-emitting element.
Figure 6:
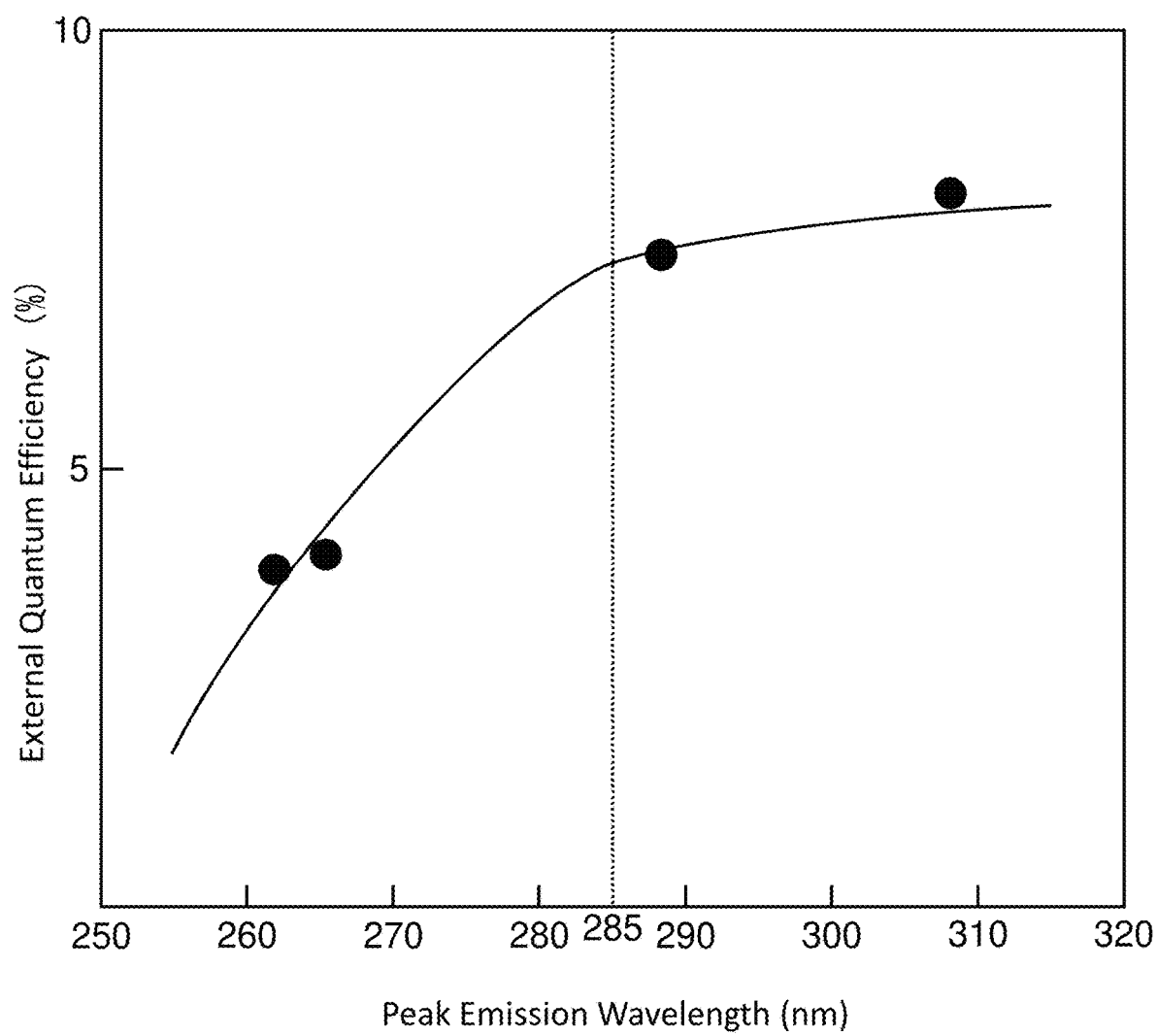
FIG. 6 is a graph showing the relationship between the peak emission wavelength and the external quantum efficiency of a nitride semiconductor light-emitting element.

Combining these facts, it is assumed that LED265 has a larger Al composition ratio than LED300 and an increased number of Al vacancies, which are cation vacancies, and thus the non-radiative recombination easily occurs, the number of carriers radiatively recombined is reduced, and the light emission efficiency is also reduced. As shown in FIGS. 5 and 6, it is assumed in the nitride semiconductor ultraviolet light-emitting element having a peak emission wavelength of 285 nm or shorter that as the peak emission wavelength is reduced, the Al composition ratio of the light-emitting layer is increased and the number of Al vacancies is also increased, and thus as the peak emission wavelength is reduced, the light emission efficiency is reduced.

As described above, the cause of decrease in light emission efficiency of the nitride semiconductor ultraviolet light-emitting element having a peak emission wavelength of 285 nm or shorter is Al vacancies in the light-emitting layer. A nitride semiconductor ultraviolet light-emitting element that achieves improved light emission efficiency by reducing the number of Al vacancies and a manufacturing method of the nitride semiconductor ultraviolet light-emitting element are described below with reference to the drawings.

<Configurational Example of Nitride Semiconductor Ultraviolet Light-Emitting Element>

Figure 2:
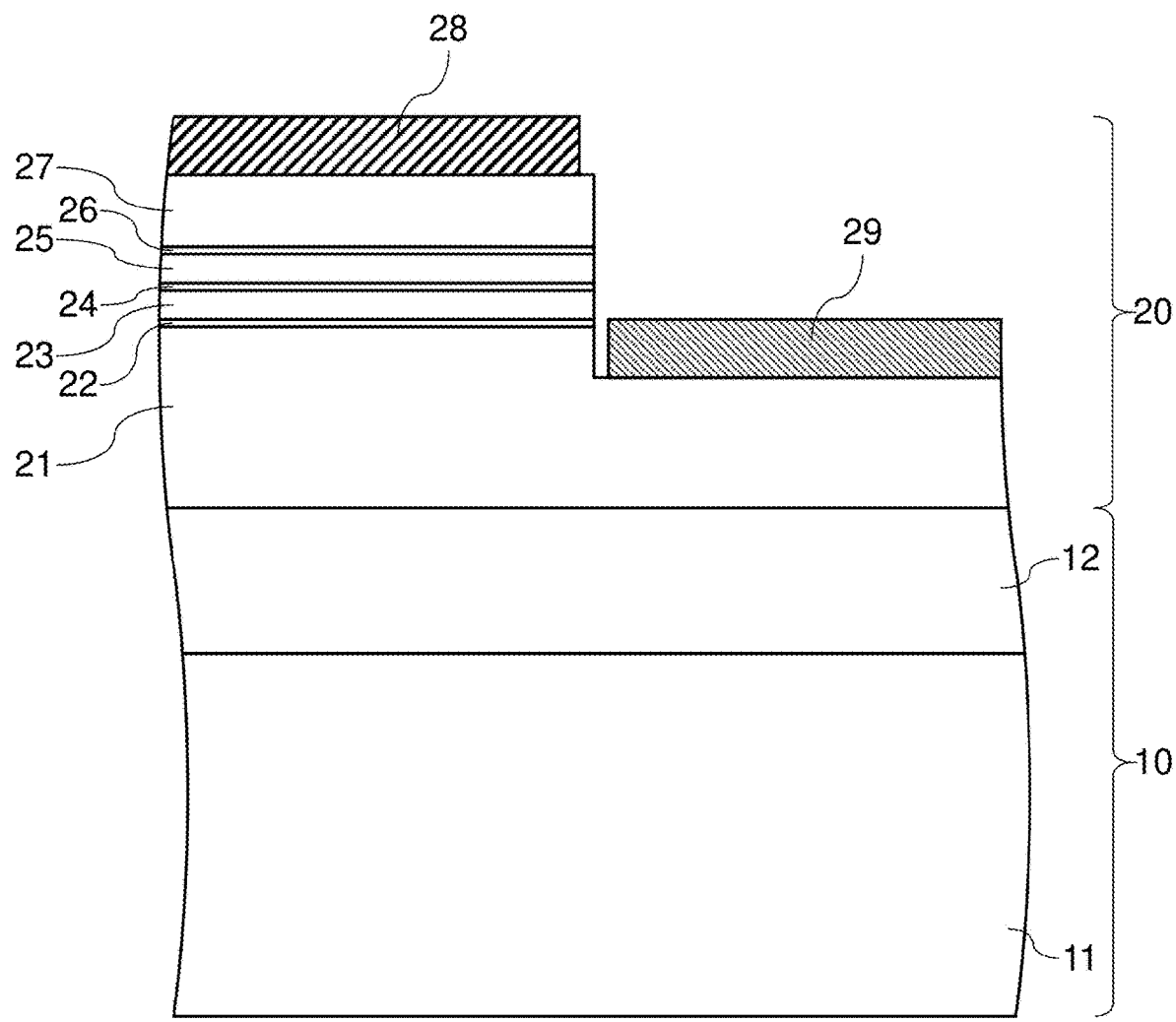
FIG. 2 is a cross-sectional view of a main part, schematically showing an example of a configuration of a nitride semiconductor ultraviolet light-emitting element according to the embodiment of the present invention.
Figure 3:
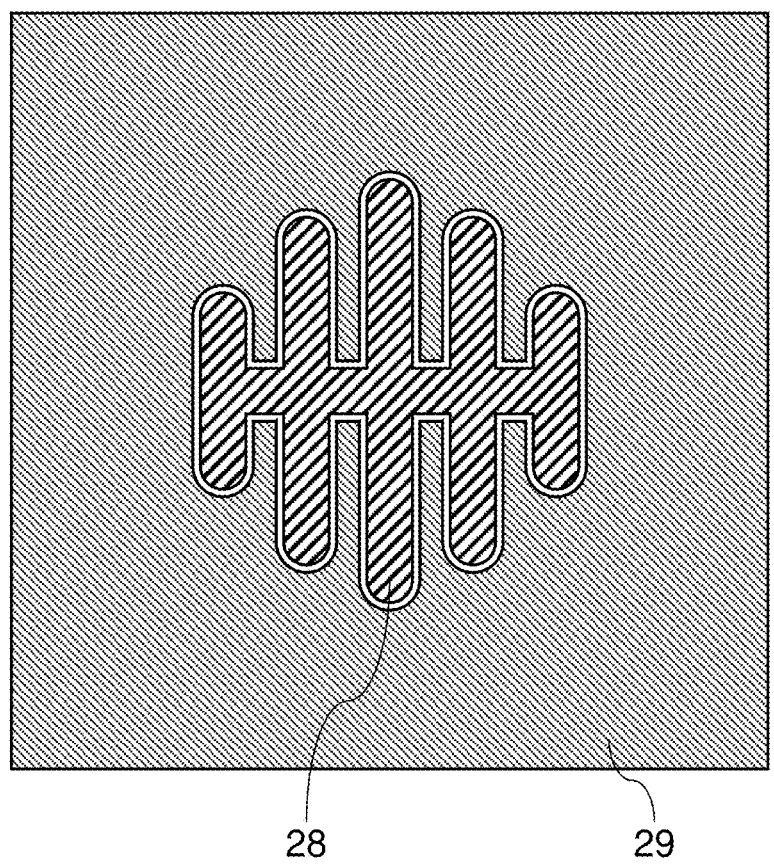
FIG. 3 is a plan view schematically showing an example of the configuration of the nitride semiconductor ultraviolet light-emitting element shown in FIG. 2 as viewed from above in FIG. 2.

An example of a configuration of a nitride semiconductor ultraviolet light-emitting element according to an embodiment of the present invention is described first with reference to the drawings. FIG. 2 is a cross-sectional view of a main part, schematically showing an example of the configuration of the nitride semiconductor ultraviolet light-emitting element according to the embodiment of the present invention. FIG. 3 is a plan view schematically showing an example of the configuration of the nitride semiconductor ultraviolet light-emitting element shown in FIG. 2 as viewed from above in FIG. 2. In FIG. 2, thicknesses (vertical lengths in the drawing) of a substrate, a semiconductor layer, and an electrode are schematically shown for convenience, and thus these thicknesses do not always match an actual dimension ratio. In the following description, the AlGaN-based semiconductor is AlGaN, AlN, or GaN. Alternatively, the AlGaN-based semiconductor is AlGaN, AlN, or GaN containing a small amount of impurity (for example, Si, Mg, or In). If necessary, subscripts are attached to Al and Ga to represent a relative composition ratio of Al and Ga (for example, $Al_XGa_{1-X}N$). In addition, in the following description, the semiconductor layer without a p-type or an n-type attached thereto is an undoped semiconductor, but may contain a small amount of impurity inevitably mixed with the undoped semiconductor layer.

As shown in FIGS. 2 and 3, a nitride semiconductor ultraviolet light-emitting element 1 according to the embodiment of the present invention includes an underlying portion 10 including a sapphire substrate 11, and an element structure portion 20 including nitride semiconductor layers and electrodes. The nitride semiconductor ultraviolet light-emitting element 1 is mounted (flip-chip mounted) on a mounting base with facing a side of the element structure portion 20 (an upper side in FIG. 2) toward the mounting base, and light is extracted from a side of the underlying portion 10 (a lower side in FIG. 2).

The underlying portion 10 includes the sapphire substrate 11 having a (0001) surface as a main surface and an AlN layer 12 that is formed on the main surface of the sapphire substrate 11. The sapphire substrate 11 may be an off substrate whose main surface is inclined with respect to the (0001) surface by a small angle (for example, larger than 0° and equal to or smaller than 3.0°). Additionally, the AlN layer 12 may contain a small amount of Ga or other impurities, or a layer composed of an AlGaN-based semiconductor may be further formed on an upper surface of the AlN layer 12.

The element structure portion 20 is configured in a manner that, from the side of the underlying portion 10, an n-type cladding layer 21 (n-type semiconductor layer) composed of an n-type $Al_XGa_{1-X}N$-based semiconductor (1>X≥0.5), a first decomposition prevention layer 22 composed of an $Al_\alpha Ga_{1-\alpha}N$-based semiconductor (1≥α>X), an active layer 23 that includes a light-emitting layer composed of an $Al_YGa_{1-Y}N$-based semiconductor (X>Y>0), that is composed of an AlGaN-based semiconductor as a whole, and that includes an uppermost layer composed of an $Al_{Y1}Ga_{1-Y1}N$-based semiconductor (X>Y1≥Y), a second decomposition prevention layer 24 composed of an $Al_\beta Ga_{1-\beta}N$-based semiconductor (1≥β>Y1), an electron blocking layer 25 composed of a p-type $Al_ZGa_{1-Z}N$-based semiconductor (1>Z>Y), a third decomposition prevention layer 26 composed of an $Al_\gamma Ga_{1-\gamma}N$-based semiconductor (1≥γ>Z), and a p-type contact layer 27 composed of a p-type $Al_QGa_{1-Q}N$-based semiconductor (Z>Q≥0) are laminated in this order.

The element structure portion 20 further includes a p-electrode 28 that is composed of, for example, Ni/Au and is formed on an upper surface of the p-type contact layer 27 and an n-electrode 29 that is composed of, for example, Ti/Al/Ti/Au and is formed on an upper surface of the n-type cladding layer 21 in a partial region where the n-type cladding layer 21 is exposed. When electrical current is applied between the p-electrode 28 and the n-electrode 29 in a manner that holes are supplied from the p-electrode 28 and electrons are supplied from the n-electrode 29, the supplied holes and electrons reach the light-emitting layer in the active layer 23, and the electrons and holes recombine and emit light in the light-emitting layer.

The active layer 23 has a single or multiple quantum well structure in which one or more well layers functioning as the light-emitting layer composed of the $Al_YGa_{1-Y}N$-based semiconductor and one or more barrier layers composed of an $Al_RGa_{1-R}N$-based semiconductor (1>R>Y) are alternately laminated. The uppermost layer of the active layer 23 is the barrier layer (or the well layer). The active layer 23 may be configured to include only the light-emitting layer composed of the $Al_YGa_{1-Y}N$-based semiconductor (in this case, the uppermost layer is also the light-emitting layer). In view of enhancing the light emission efficiency of the nitride semiconductor ultraviolet light-emitting element 1, the active layer 23 preferably has a quantum well structure (in particular, a multiple quantum well structure).

Each of the first decomposition prevention layer 22, the second decomposition prevention layer 24, and the third decomposition prevention layer 26 is typically composed of AlN (that is, α=1, β=1, and γ=1), and preferably has a thickness of 3 nm or less, and more preferably has a thickness of 2 nm or less. As will be described later in further detail in <Example of Manufacturing Method of Nitride Semiconductor Ultraviolet Light-Emitting Element>, the layers 22, 24, and 26 are formed for protecting the layers 21, 23, and 25 immediately under the layers 22, 24, and 26, respectively, and do not contribute to light emission, and thus are preferably formed to be as thin as possible so as to achieve reduced resistance.

The p-type contact layer 27 is typically composed of GaN (that is, Q=0). A layer composed of a p-type AlGaN-based semiconductor having an Al composition ratio smaller than that of the electron blocking layer 25 and larger than that of the p-type contact layer 27 may be provided between the electron blocking layer 25 and the p-type contact layer 27.

The composition ratios (X, Y, Y1, Z, Q, R, α, β, and γ) of Al and Ga in the AlGaN-based semiconductors composing the layers 21 to 27 are appropriately set in a manner that the magnitude relationships described above are satisfied and the nitride semiconductor ultraviolet light-emitting element 1 emits light having a desired peak emission wavelength.

<Example of Manufacturing Method of Nitride Semiconductor Ultraviolet Light-Emitting Element>

Next, an example of a manufacturing method of the nitride semiconductor ultraviolet light-emitting element 1 shown in FIG. 2 is described.

The AlN layer 12 included in the underlying portion 10 and the layers 21 to 27 composed of nitride semiconductors and included in the element structure portion 20 are epitaxially grown on the sapphire substrate 11 using a well-known epitaxial growth method such as a metal organic vapor phase epitaxy (MOVPE) method or a molecular beam epitaxy (MBE) method to be laminated thereon in this order. In this case, a donor impurity, for example Si, is doped in an n-type layer whereas an acceptor impurity, for example Mg, is doped in a p-type layer.

Next, a partial region is selectively etched using a well-known etching method such as a reactive ion etching, so that the n-type cladding layer 21 in the region is exposed. The p-electrode 28 is formed on the p-type contact layer 27 in an unetched region and the n-electrode 29 is formed on the n-type cladding layer 21 in the etched region using a well-known film forming method such as an electron beam deposition method. After one or both of the p-electrode 28 and the n-electrode 29 are formed, a thermal treatment may be performed using a well-known thermal treatment method such as RTA (rapid thermal annealing).

As described in <Cause of Decrease in Light Emission Efficiency>, the cause of decrease in light emission efficiency of the nitride semiconductor ultraviolet light-emitting element having a peak emission wavelength of 285 nm or shorter is Al vacancies in the light-emitting layer. Consequently, the nitride semiconductor ultraviolet light-emitting element 1 is manufactured by a manufacturing method that reduces the number of Al vacancies in the light-emitting layer.

Figure 4:
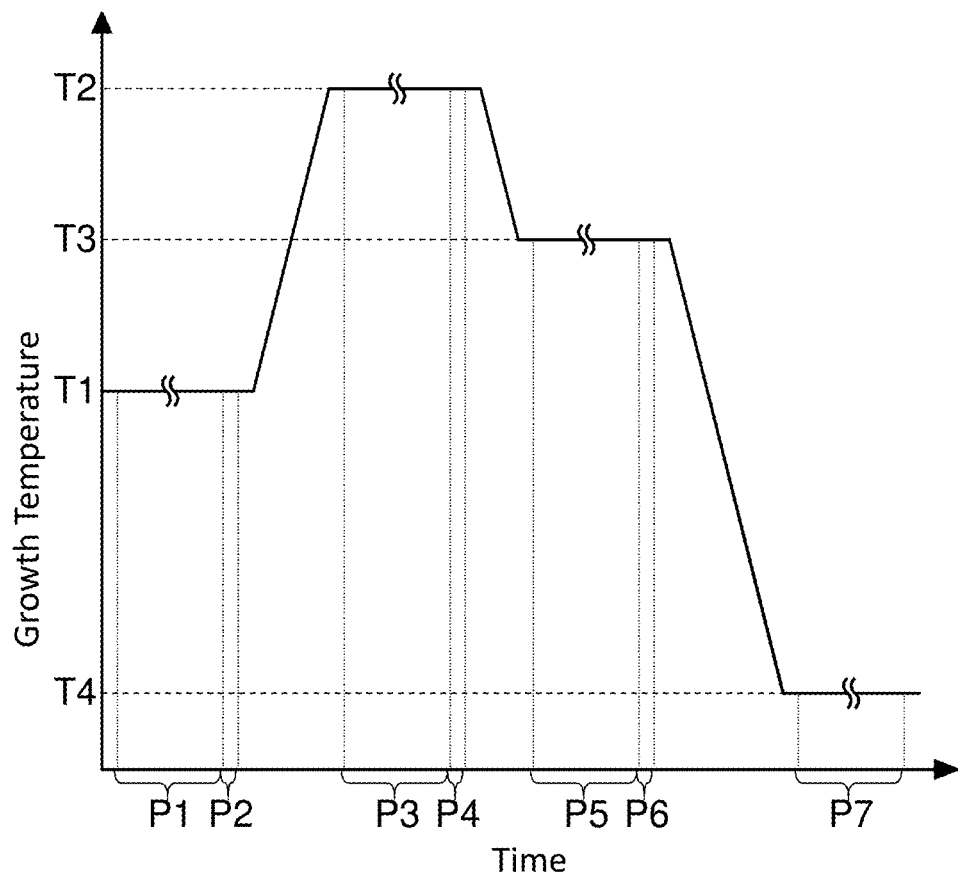
FIG. 4 is a timing chart schematically showing an example of a manufacturing method of the nitride semiconductor ultraviolet light-emitting element according to the embodiment of the present invention.

An example of the manufacturing method that reduces the number of Al vacancies in the light-emitting layer is described with reference to the drawings. FIG. 4 is a timing chart schematically showing an example of a manufacturing method of a nitride semiconductor ultraviolet light-emitting element according to the embodiment of the present invention. The timing chart shown in FIG. 4 shows the growth temperature at the time of forming the layers 21 to 27 composed of nitride semiconductors and included in the element structure portion 20. The vertical axis of the timing chart represents the growth temperature and the horizontal axis represents the time. The growth temperature is typically a wafer (a substrate) temperature, but depends on a heating system employed by a device used for epitaxial growth. In addition, whether the layers 21 to 27 are grown can be controlled by, for example, determining whether a material is supplied to a wafer surface. For example, the composition ratio of each of the layers 21 to 27 can be controlled by the supply ratio of the material.

As shown in FIG. 4, in the manufacturing method of the nitride semiconductor ultraviolet light-emitting element 1 according to the embodiment of the present invention, the n-type cladding layer 21 is grown first at a growth temperature T1 during a period P1. The first decomposition prevention layer 22 is grown following the n-type cladding layer 21 at the growth temperature T1 during a period P2 immediately after the period P1.

Next, the growth temperature is increased from T1 to T2, and then the active layer 23 is grown at the growth temperature T2 during a period P3. The second decomposition prevention layer 24 is grown following the active layer 23 at the growth temperature T2 during a period P4 immediately after the period P3.

Next, the growth temperature is reduced from T2 to T3, and then the electron blocking layer 25 is grown at the growth temperature T3 during a period P5. The third decomposition prevention layer 26 is grown following the electron blocking layer 25 at the growth temperature T3 during a period P6 immediately after the period P5. While FIG. 4 exemplifies a case where the growth temperature T3 is higher than the growth temperature T1, the growth temperature T3 may be lower than the growth temperature T1, or the growth temperature T3 may be equal to the growth temperature T1.

Next, the growth temperature is reduced from T3 to T4, and then the p-type contact layer 27 is grown at the growth temperature T4 during a period P7. In this way, the growth of the layers 21 to 27 is completed.

In general, the growth temperature of AlGaN, which is a mixed crystal of AlN and GaN, is preferably approximately 1100° C. at the highest. This is because, although the growth temperature is preferably increased to facilitate migration of atoms on a growth surface (in particular, migration of Al atoms that are bonded to N atoms with large bonding force and thus hardly move) for the purpose of achieving excellent crystals with less defects or the like, there is a restriction that the growth temperature needs to be kept low for the purpose of preventing the decomposition (the re-evaporation) of GaN. As a result, the upper limit of the range that allows for balancing these conditions is approximately 1100° C. (for example, see paragraphs [0004], [0005], and [0044] in Japanese Patent Application Publication No. 2005-32803).

Moreover, in general, when a light-emitting layer is composed of AlGaN, to locally reduce the band gap of the light-emitting layer for the purpose of confining carriers therein, it is necessary that the Ga composition ratio of the light-emitting layer is at least larger (the Al composition ratio is smaller) than the Ga composition ratio of layers composed of n-type and p-type AlGaN (or AlN) with the light-emitting layer being interposed between these layers. For this reason, the light-emitting layer needs to sufficiently take in Ga, and thus it is particularly necessary to reduce the growth temperature of the light-emitting layer. As the peak emission wavelength of a nitride semiconductor light-emitting element is reduced, the band gap of the light-emitting layer is increased and the Ga composition ratio is reduced. However, it is necessary to take in Ga, and thus the growth temperature is preferably approximately 1100° C. For example, while the nitride semiconductor ultraviolet light-emitting element described in Patent Document 1 has a peak emission wavelength of 254 nm, which is shorter than 285 nm where there is a problem about reduced light emission efficiency described above, the growth temperature of the light-emitting layer is 1120° C. (for example, see paragraphs [0026] and [0035] in Patent Document 1).

In the manufacturing method of the nitride semiconductor ultraviolet light-emitting element shown in FIG. 4, the growth temperature of the active layer 23 including the light-emitting layer (for example, the well layer with the quantum well structure) is higher than the typical growth temperature of a light-emitting layer mentioned above (approximately 1100° C.). Specifically, the growth temperature T2 is set to be higher than 1200° C. The migration of Al atoms during the growth of the light-emitting layer is facilitated and thus the number of Al vacancies in the light-emitting layer is reduced.

As described above, the manufacturing method of the nitride semiconductor ultraviolet light-emitting element 1 according to the embodiment of the present invention can reduce the number of Al vacancies in the light-emitting layer, which are the cause of decrease in light emission efficiency of the nitride semiconductor ultraviolet light-emitting element having a peak emission wavelength of 285 nm or shorter, and can improve the light emission efficiency.

The upper limit of the optimal growth temperature of AlGaN is approximately 1100° C., as described above. If the growth temperature is higher than 1200° C., there may arise a problem that GaN is decomposed (re-evaporated) intensively. This problem can be solved by optimizing other growth conditions than the growth temperature, for example, increasing the supply amount of a material for Ga as compared to conventional cases, but the production efficiency may be reduced such as the consumption amount of the material may be increased or the growth speed may be reduced. It is conventionally believed that even if the growth temperature of AlGaN is higher than 1200° C., only the demerits mentioned above are found. Consequently, temperatures higher than 1200° C. are not selected as the growth temperature of AlGaN.

As a result of intensive research, however, in the nitride semiconductor ultraviolet light-emitting element having a peak emission wavelength of 285 nm or shorter, the inventors of the present application have identified that the cause of decrease in light emission efficiency is Al vacancies in the light-emitting layer and have found that the number of Al vacancies can be reduced and the light emission efficiency can be improved by increasing the growth temperature of the light-emitting layer to 1200° C. or higher. In addition, the manufacturing method of the nitride semiconductor ultraviolet light-emitting element 1 can solve an unsolved problem, that is, can improve the light emission efficiency in the nitride semiconductor ultraviolet light-emitting element having a peak emission wavelength of 285 nm or shorter, although the production efficiency is reduced.

In the manufacturing method of the nitride semiconductor ultraviolet light-emitting element 1 shown in FIG. 4, which requires changing the growth temperature midway, it takes a certain time to change the growth temperature. If a layer composed of AlGaN is exposed at the time of changing the growth temperature, GaN may be decomposed. In particular, the growth temperature T2 of the active layer 23 is higher than 1200° C. Consequently, when the growth temperature is increased from T1 to T2, GaN may be decomposed in the n-type cladding layer 21 and when the growth temperature is reduced from T2 to T3, GaN may be decomposed in the active layer 23. Moreover, the growth temperature T3 of the electron blocking layer 25 having a large Al composition ratio is much higher than the growth temperature T4 of the p-type contact layer having a small Al composition ratio (for example, by 150° C. or more), and thus it takes time to reduce the growth temperature from T3 to T4. Consequently, GaN may be decomposed in the electron blocking layer 25. Due to the decomposition of GaN in the n-type cladding layer 21, the active layer 23, and the electron blocking layer 25, characteristics (for example, the light emission efficiency) of the nitride semiconductor ultraviolet light-emitting element 1 may be degraded.

In the manufacturing method of the nitride semiconductor ultraviolet light-emitting element shown in FIG. 4, the first decomposition prevention layer 22, the second decomposition prevention layer 24, and the third decomposition prevention layer 26 are formed to prevent the decomposition of GaN in the underlying layers 21, 23, and 25, respectively. Each of the first decomposition prevention layer 22, the second decomposition prevention layer 24, and the third decomposition prevention layer 26 is preferably a layer having a larger Al composition ratio (that is, having less influence of the decomposition of GaN) than layers to be protected and is preferably composed of AlN.

The growth temperature T2 of the active layer 23 may be equal to or higher than 1250° C. Temperatures equal to or higher than 1250° C. are used not for the crystal growth of the element structure portion 20 but for the crystal growth of the AlN layer 12 included in the underlying portion 10 (for example, see paragraph [0041] in Japanese Patent Application Publication No. 2015-043468), and sufficient migration of Al atoms is expected at such temperatures. Consequently, by growing the active layer 23 at temperatures equal to or higher than 1250° C., the migration of Al atoms is sufficiently accelerated to effectively reduce the number of Al vacancies in the light-emitting layer.

The growth temperature T2 of the active layer 23 is, for example, equal to or lower than 1350° C. and preferably equal to or lower than 1300° C.

<Modifications and the Like>

The configuration of the nitride semiconductor ultraviolet light-emitting element 1 shown in FIG. 2 and the manufacturing method of the nitride semiconductor ultraviolet light-emitting element shown in FIG. 4 are only examples, and may be appropriately modified as exemplified below. Modifications described below may be carried out in appropriate combination as long as there is no contradiction.

While FIG. 4 exemplifies a case where the growth temperature T2 of the active layer 23 is higher than the growth temperature T1 of the n-type cladding layer 21, the growth temperature T1 may be equal to the growth temperature T2.

As shown in FIG. 2, the nitride semiconductor ultraviolet light-emitting element 1 includes the sapphire substrate 11 functioning as an insulator, and thus it is necessary to form the n-electrode 29 on the upper surface of the n-type cladding layer 21 that is processed to be partially exposed. To perform such processing, it is necessary to grow the n-type cladding layer 21 to be thicker than the other layers 22 to 27. For example, while the layers 22 to 27 other than the n-type cladding layer 21 have a thickness of approximately a few nanometers to a hundred of nanometers, the n-type cladding layer 21 has a thickness of 1 μm or more. In this case, if the n-type cladding layer 21 is grown at a temperature higher than 1200° C., which is the same as in the active layer 23, production efficiency may be significantly degraded. Consequently, as exemplified in FIG. 4, it is preferable to select a temperature suitable for growing an n-type $Al_XGa_{1-X}N$-based semiconductor (1≥X≥0.5) as the growth temperature T1 of the n-type cladding layer 21 and then to separately select a temperature higher than the growth temperature T1 as the growth temperature T2 of the active layer 23.

While FIG. 4 exemplifies a case where the growth temperature T3 of the electron blocking layer 25 is lower than the growth temperature T2 of the active layer 23, the growth temperature T2 may be equal to the growth temperature T3.

However, as the growth temperature of Mg, which is an acceptor impurity, is increased, it is more difficult to dope Mg. Consequently, as exemplified in FIG. 4, the growth temperature T3 of the electron blocking layer 25 is preferably lower than the growth temperature T2 of the active layer 23, because it is possible to increase the amount of the acceptor impurity doped as compared to a case where the electron blocking layer 25 is grown at the growth temperature T2, which is the same as in the active layer 23.

While FIG. 4 exemplifies a case where the growth temperature T4 of the p-type contact layer 27 is lower than the growth temperature T3 of the electron blocking layer 25, the growth temperature T3 may be equal to the growth temperature T4.

As exemplified in FIG. 4, the growth temperature T4 of the p-type contact layer 27 in which the Ga composition ratio is larger than that of the electron blocking layer 25 and thus GaN is intensively decomposed (re-evaporated) during growth is preferably lower than the growth temperature T3 of the electron blocking layer 25, because the p-type contact layer 27 can be efficiently grown.

While FIGS. 2 and 4 exemplify the nitride semiconductor ultraviolet light-emitting element 1 including the first decomposition prevention layer 22 and the manufacturing method of the nitride semiconductor ultraviolet light-emitting element 1, the first decomposition prevention layer 22 is not necessarily required.

For example, when the growth temperature T1 of the n-type cladding layer 21 is equal to the growth temperature T2 of the active layer 23, the active layer 23 can start to grow immediately after the growth of the n-type cladding layer 21, and thus it is not necessary to form the first decomposition prevention layer 22.

In addition, for example, if the growth temperature T2 of the active layer 23 is higher than the growth temperature T1 of the n-type cladding layer 21, as long as portions having a large Al composition ratio because of the decomposition of GaN on the upper surface of the n-type cladding layer 21 do not significantly affect the characteristics of the nitride semiconductor ultraviolet light-emitting element 1 (for example, as long as the portions have a thickness of approximately a few nanometers), it is not necessary to form the first decomposition prevention layer 22.

Moreover, for example, when an n-type $Al_XGa_{1-X}N$-based semiconductor composing the n-type cladding layer 21 does not contain Ga (X=1), it is not necessary to form the first decomposition prevention layer 22.

While FIGS. 2 and 4 exemplify the nitride semiconductor ultraviolet light-emitting element 1 including the second decomposition prevention layer 24 and the manufacturing method of the nitride semiconductor ultraviolet light-emitting element 1, the second decomposition prevention layer 24 is not necessarily required.

For example, when the growth temperature T2 of the active layer 23 is equal to the growth temperature T3 of the electron blocking layer 25, the electron blocking layer 25 can start to grow immediately after the growth of the active layer 23, and thus it is not necessary to form the second decomposition prevention layer 24.

In addition, for example, if the growth temperature T3 of the electron blocking layer 25 is lower than the growth temperature T2 of the active layer 23, as long as portions having a large Al composition ratio because of the decomposition of GaN on the upper surface of the active layer 23 do not significantly affect the characteristics of the nitride semiconductor ultraviolet light-emitting element 1 (for example, as long as the portions have a thickness of approximately a few nanometers), it is not necessary to form the second decomposition prevention layer 24.

While FIGS. 2 and 4 exemplify the nitride semiconductor ultraviolet light-emitting element 1 including the third decomposition prevention layer 26 and the manufacturing method of the nitride semiconductor ultraviolet light-emitting element 1, the third decomposition prevention layer 26 is not necessarily required.

For example, when the growth temperature T3 of the electron blocking layer 25 is equal to the growth temperature T4 of the p-type contact layer 27, the p-type contact layer 27 can start to grow immediately after the growth of the electron blocking layer 25, and thus it is not necessary to form the third decomposition prevention layer 26.

In addition, for example, if the growth temperature T4 of the p-type contact layer 27 is lower than the growth temperature T3 of the electron blocking layer 25, as long as portions having a large Al composition ratio because of the decomposition of GaN on the upper surface of the electron blocking layer 25 do not significantly affect the characteristics of the nitride semiconductor ultraviolet light-emitting element 1 (for example, as long as the portions have a thickness of approximately a few nanometers), it is not necessary to form the third decomposition prevention layer 26.

Moreover, for example, when a p-type $Al_ZGa_{1-Z}N$-based semiconductor composing the electron blocking layer 25 does not contain Ga (Z=1), it is not necessary to form the third decomposition prevention layer 26.

Moreover, for example, when the growth temperature T3 of the electron blocking layer 25 is equal to or lower than 1100° C., the growth temperature T3 is not so high. If the growth temperature is reduced from T3 to T4, GaN is hardly decomposed on the upper surface of the electron blocking layer 25. As a result, it is not necessary to form the third decomposition prevention layer 26.

During the growth of a light-emitting layer, Al atoms may be migrated insufficiently and thus may be slightly shifted from crystal lattice positions thereof. After the electron blocking layer 25 is grown, it is possible to add a step of performing a thermal treatment at a temperature higher than 1200° C. while supplying a gas containing 50% or more of nitrogen (other components are, for example, hydrogen and an inert gas such as argon).

As the step of the thermal treatment is added, the movement of Al atoms slightly shifted from the crystal lattice positions in the light-emitting layer is facilitated and thus the number of Al vacancies in the light-emitting layer can be further reduced. As a gas containing 50% or more of nitrogen is supplied at the step of the thermal treatment, it is possible to prevent the decomposition of AlN and GaN, and prevent the generation of N vacancies or reduce the number of N vacancies.

When the step of the thermal treatment is performed, the third decomposition prevention layer 26 may be formed before the step. Alternatively, the growth temperature T3 of the electron blocking layer 25 may be set to be higher than 1200° C. (for example, set to be equal to the growth temperature T2 of the active layer 23) and then the step of the thermal treatment may be performed at the same temperature as the growth temperature T3 or may be performed at a temperature higher (or lower) than the growth temperature T3.

It is only required that the step of the thermal treatment is performed at least after the growth of the active layer 23. Consequently, the step of the thermal treatment may be performed before the growth of the electron blocking layer 25. For example, after the growth of the second decomposition prevention layer 24, the step of the thermal treatment may be performed at the same temperature as the growth temperature T2 or may be performed at a temperature higher (or lower) than the growth temperature T2.

Moreover, the p-type contact layer 27 has a relatively large Ga composition ratio (typically, GaN). Consequently, when the thermal treatment is performed on the p-type contact layer 27 at a temperature higher than 1200° C., GaN may be decomposed. It is thus preferable to perform the step of the thermal treatment before the growth of the p-type contact layer 27.

INDUSTRIAL APPLICABILITY

The present invention is applicable to a nitride semiconductor ultraviolet light-emitting element including a light-emitting layer composed of an AlGaN-based semiconductor and having a peak emission wavelength of 285 nm or shorter, and a manufacturing method of the nitride semiconductor ultraviolet light-emitting element.

DESCRIPTION OF SYMBOLS

1 nitride semiconductor ultraviolet light-emitting element
10 underlying portion
11 sapphire substrate
12 AlN layer
20 element structure portion
21 n-type cladding layer (n-type semiconductor layer)
22 first decomposition prevention layer
23 active layer
24 second decomposition prevention layer
25 electron blocking layer (p-type semiconductor layer)
26 third decomposition prevention layer
27 p-type contact layer 28 p-electrode
29 n-electrode
T1 to T4 growth temperature
P1 to P7 period

The invention claimed is:

1. A manufacturing method of a nitride semiconductor ultraviolet light-emitting element having a peak emission wavelength of 285 nm or shorter comprising:
    a first step of forming an n-type semiconductor layer composed of an n-type $Al_XGa_{1-X}N$-based semiconductor ($1≥X≥0.5$) on an upper surface of an underlying portion including a sapphire substrate;
    a second step of forming, above the n-type semiconductor layer, an active layer that includes a light-emitting layer composed of an $Al_YGa_{1-Y}N$-based semiconductor ($X>Y>0$) and that is composed of an AlGaN-based semiconductor as a whole; and
    a third step of forming a p-type semiconductor layer composed of a p-type $Al_ZGa_{1-Z}N$-based semiconductor ($1≥Z>Y$) above the active layer, wherein
    a growth temperature at the second step is higher than 1200° C. and equal to or higher than a growth temperature at the first step.

2. The manufacturing method of a nitride semiconductor ultraviolet light-emitting element according to claim 1, wherein a growth temperature at the second step is higher than a growth temperature at the first step.

3. The manufacturing method of a nitride semiconductor ultraviolet light-emitting element according to claim 2, further comprising a fourth step of forming a first decomposition prevention layer following the n-type semiconductor layer at a same growth temperature as the first step immediately after the first step, wherein
    the n-type semiconductor layer composed of an n-type $Al_XGa_{1-X}N$-based semiconductor ($1>X≥0.5$) is formed at the first step,
    the first decomposition prevention layer is composed of an $Al_αGa_{1-α}N$-based semiconductor ($1≥α>X$), and has a thickness of 3 nm or less, and
    at least after the fourth step ends, a growth temperature is increased and then the second step is performed.

4. The manufacturing method of a nitride semiconductor ultraviolet light-emitting element according to claim 1, wherein a growth temperature at the third step is lower than a growth temperature at the second step.

5. The manufacturing method of a nitride semiconductor ultraviolet light-emitting element according to claim 4, further comprising a fifth step of forming a second decomposition prevention layer following the active layer at a same growth temperature as the second step immediately after the second step, wherein
    an uppermost layer of the active layer is composed of an $Al_{Y1}Ga_{1-Y1}N$-based semiconductor ($X>Y1≥Y$),
    the second decomposition prevention layer is composed of an $Al_βGa_{1-β}N$-based semiconductor ($1≥β>Y1$), and has a thickness of 3 nm or less and at least after the fifth step ends, a growth temperature is reduced and then the third step is performed.

6. The manufacturing method of a nitride semiconductor ultraviolet light-emitting element according to claim 1, further comprising a sixth step of forming a p-type contact layer composed of a p-type $Al_QGa_{1-Q}N$-based semiconductor ($Z>Q≥0$) above the p-type semiconductor layer, wherein
    a growth temperature at the sixth step is lower than a growth temperature at the third step.

7. The manufacturing method of a nitride semiconductor ultraviolet light-emitting element according to claim 6, further comprising a seventh step of forming a third decomposition prevention layer following the p-type semiconductor layer at a same growth temperature as the third step immediately after the third step, wherein
    the p-type semiconductor layer composed of a p-type $Al_ZGa_{1-Z}N$-based semiconductor ($1>Z>Y$) is formed at the third step,
    the third decomposition prevention layer is composed of an $Al_γGa_{1-γ}N$-based semiconductor ($1≥γ>Z$), and has a thickness of 3 nm or less, and
    at least after the seventh step ends, a growth temperature is reduced and then the sixth step is performed.

8. The manufacturing method of a nitride semiconductor ultraviolet light-emitting element according to claim 7, wherein a growth temperature at the sixth step is lower than a growth temperature at the third step by 150° C. or more.

9. The manufacturing method of a nitride semiconductor ultraviolet light-emitting element according to claim 1, further comprising an eighth step of performing a thermal treatment at a temperature higher than 1200° C. while supplying a gas containing 50% or more of nitrogen at least after the second step ends.

10. The manufacturing method of a nitride semiconductor ultraviolet light-emitting element according to claim 6, wherein a growth temperature at the third step is equal to or lower than 1100° C.

11. The manufacturing method of a nitride semiconductor ultraviolet light-emitting element according to claim 1, wherein the second step is a step of forming the active layer that has a single or multiple quantum well structure in which one or more well layers functioning as the light-emitting layer and one or more barrier layers composed of an $Al_RGa_{1-R}N$-based semiconductor ($1>R>Y$) are alternately laminated.

12. The manufacturing method of a nitride semiconductor ultraviolet light-emitting element according to claim 1, wherein a growth temperature at the second step is equal to or higher than 1250° C.

13. A nitride semiconductor ultraviolet light-emitting element having a peak emission wavelength of 285 nm or shorter comprising:
    an underlying portion including a sapphire substrate;
    an n-type semiconductor layer composed of an n-type $Al_XGa_{1-X}N$-based semiconductor ($1>X≥0.5$), the n-type semiconductor layer being formed on an upper surface of the underlying portion;
    an active layer that includes a light-emitting layer composed of an $Al_YGa_{1-Y}N$-based semiconductor ($X>Y>0$) and that is composed of an AlGaN-based semiconductor as a whole, the active layer being formed above the n-type semiconductor layer; and
    a p-type semiconductor layer composed of a p-type $Al_ZGa_{1-Z}N$-based semiconductor ($1≥Z>Y$), the p-type semiconductor layer being formed above the active layer, wherein
    an Al composition ratio on an upper surface of the n-type semiconductor layer is larger than that inside of the n-type semiconductor layer, or a first decomposition prevention layer composed of an $Al_αGa_{1-α}N$-based semiconductor ($1≥α>X$) and having a thickness of 3 nm or less is formed on the upper surface of the n-type semiconductor layer.

14. The nitride semiconductor ultraviolet light-emitting element according to claim 13, wherein
    an uppermost layer of the active layer is composed of an $Al_{Y1}Ga_{1-Y1}N$-based semiconductor ($X>Y1≥Y$), and an Al composition ratio on an upper surface of the uppermost layer is larger than that inside of the uppermost layer, or a second decomposition prevention layer composed of an $Al_\beta Ga_{1-\beta}N$-based semiconductor ($1 \geq \beta > Y1$) and having a thickness of 3 nm or less is formed on an upper surface of the active layer.

15. The nitride semiconductor ultraviolet light-emitting element according to claim 13, further comprising a p-type contact layer formed above the p-type semiconductor layer, wherein the p-type semiconductor layer is composed of a p-type $Al_Z Ga_{1-Z}N$-based semiconductor ($1 > Z > Y$), the p-type contact layer is composed of a p-type $Al_Q Ga_{1-Q}N$-based semiconductor ($Z > Q$ A), and an Al composition ratio on an upper surface of the p-type semiconductor layer is larger than that inside of the p-type semiconductor layer, or a third decomposition prevention layer composed of an $Al_\gamma Ga_{1-\gamma}N$-based semiconductor ($1 \geq \gamma > Z$) and having a thickness of 3 nm or less is formed on the upper surface of the p-type semiconductor layer.

16. The nitride semiconductor ultraviolet light-emitting element according to claim 14, further comprising a p-type contact layer formed above the p-type semiconductor layer, wherein the p-type semiconductor layer is composed of a p-type $Al_Z Ga_{1-Z}N$-based semiconductor ($1 > Z > Y$), the p-type contact layer is composed of a p-type $Al_Q Ga_{1-Q}N$-based semiconductor ($Z > Q \geq 0$), and an Al composition ratio on an upper surface of the p-type semiconductor layer is larger than that inside of the p-type semiconductor layer, or a third decomposition prevention layer composed of an $Al_\gamma Ga_{1-\gamma}N$-based semiconductor ($1 \geq \gamma > Z$) and having a thickness of 3 nm or less is formed on the upper surface of the p-type semiconductor layer.

\* \* \* \* \*